US007990748B2

(12) United States Patent
Koda et al.

(10) Patent No.: US 7,990,748 B2

(45) Date of Patent: Aug. 2, 2011

(54) INFORMATION HOLDING METHOD

(75) Inventors: Yasunori Koda, Ashigarakami-gun (JP); Kunihiro Takahashi, Ashigarakami-gun (JP); Shoji Yamaguchi, Ashigarakami-gun (JP); Mario Fuse, Ashigarakami-gun (JP)

(73) Assignee: Fuji Xerox Co., Ltd., Tokyo (JP)

( * ) Notice: Subject to any disclaimer, the term of this patent is extended or adjusted under 35 U.S.C. 154(b) by 1400 days.

(21) Appl. No.: 11/370,870

(22) Filed: Mar. 9, 2006

(65) Prior Publication Data

US 2006/0232829 A1 Oct. 19, 2006

(30) Foreign Application Priority Data

Mar. 16, 2005 (JP) ................................ 2005-075596
Feb. 3, 2006 (JP) ................................ 2006-026845

(51) Int. Cl.
*G11C 11/00* (2006.01)

(52) U.S. Cl. ................................ 365/129; 365/189.011

(58) Field of Classification Search .................. 365/129, 365/189.011

See application file for complete search history.

(56) References Cited

U.S. PATENT DOCUMENTS

| | | | | |
|---|---|---|---|---|
| 5,482,779 | A * | 1/1996 | Bausewein et al. | 428/488.41 |
| 5,560,970 | A * | 10/1996 | Ludeb uhl | 428/41.9 |
| 5,778,011 | A * | 7/1998 | Blaum et al. | 714/755 |
| 7,420,524 | B2 * | 9/2008 | Werner et al. | 343/909 |
| 7,656,463 | B2 * | 2/2010 | Shibusawa | 348/731 |
| 2006/0187036 | A1 * | 8/2006 | Takahashi et al. | 340/551 |

FOREIGN PATENT DOCUMENTS

| | | |
|---|---|---|
| JP | A 05-073572 | 3/1993 |
| JP | A 2001-229199 | 8/2001 |
| JP | A 2002-334270 | 11/2002 |
| JP | A 2002-362730 | 12/2002 |
| JP | A 2004-102562 | 4/2004 |

* cited by examiner

*Primary Examiner* — Michael T Tran

(74) *Attorney, Agent, or Firm* — Oliff & Berridge, PLC

(57) ABSTRACT

In an information holding method according to the present invention, plural blocks are defined by an evenly sectioned surface of a sheet material in predefined positions, and predetermined information is expressed in the whole area of the sheet material by the presence/absence of information for each of the blocks.

8 Claims, 12 Drawing Sheets

12
12b
14a
14c
14e
14d
14f
a
b
c
d
e
f

INFORMATION HOLDING METHOD

CROSS-REFERENCE TO RELATED APPLICATION

This application claims priority under 35 USC 119 from Japanese Patent Application Nos. 2005-075596 and 2006-026845, the disclosures of which are incorporated by references herein.

BACKGROUND

1. Technical Field of the Invention

The present invention relates to an information holding method for holding predetermined information on a sheet material such as a recording paper.

2. Related Art

Recently, together with an improvement in the performance of copiers and printers and an improvement in processing performance of personal computers and the like, it becomes possible to highly precisely copy an image recorded on an original. As a result, it becomes possible to form a high quality image to the extent where the original and the copy are hardly distinguishable.

Meanwhile, the capability of copying an image which makes it difficult to distinguish an original and a copy, increases the likelihood of copying paper currencies and securities as well as various documents including passports, various title deeds, and various certificates. It has been desired to establish technology whereby it is possible to highly accurately distinguish whether it is true or not that various documents are the original.

SUMMARY

One aspect of the present invention is an information holding method including; defining a plurality of consecutive blocks by an evenly sectioned surface of a sheet material in predefined positions; and holding predetermined information expressed in the whole area of the sheet material by the presence/absence of information for each of the blocks.

BRIEF DESCRIPTION OF THE DRAWINGS

An embodiment of the present invention will be described in detail based on the following figures, wherein:

FIG. 11A to 11C are schematic diagrams showing an example of information holding in a paper, wherein FIG. 11A shows a paper of an information holding object, FIG. 11B shows a binder serving as an information adding device used for producing information into the paper of FIG. 11A, and FIG. 11C shows a paper having the information held therein.

DETAILED DESCRIPTION

Figure 1:
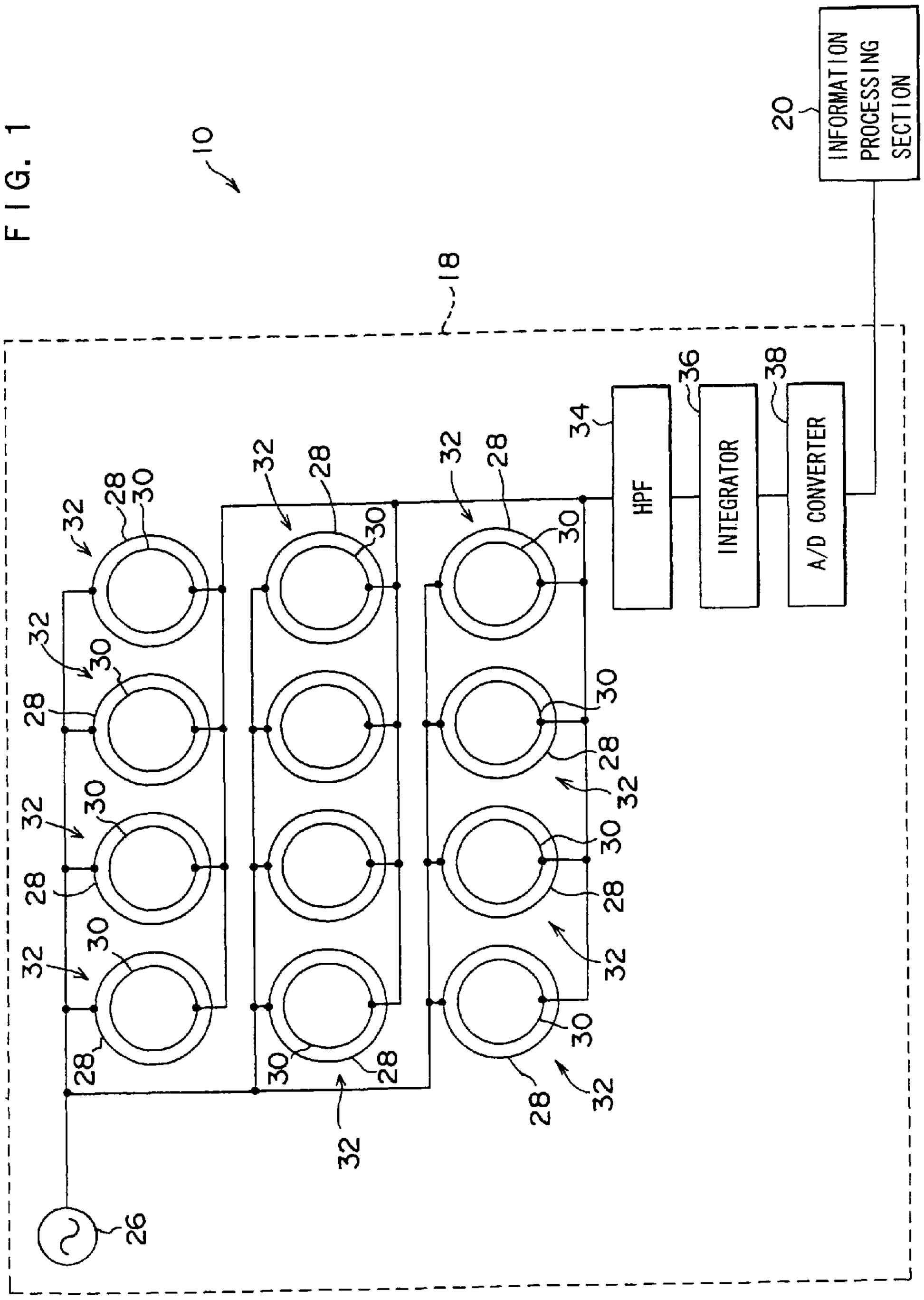
FIG. 1 is a schematic block diagram of an information reader applied to the present embodiment.

Hereunder is a description of an embodiment of the present invention, with reference to the drawings. FIG. 1 is a schematic block diagram of an information reader 10 according to the present embodiment. In the present embodiment, as an example of a sheet material, there employs a recording paper (refer to FIG. 2, hereunder a paper 12) capable of forming a document or a label having images or letters. The information reader 10 reads information held by the paper 12.

In the present embodiment, as a sheet material, a recording paper is used for description, however, the present invention is not limited to this. A membrane made from an arbitrary demagnetized material such as a resin plate, an aluminum foil, and an aluminum plate, may be utilized as material to form a sheet.

Figure 2:
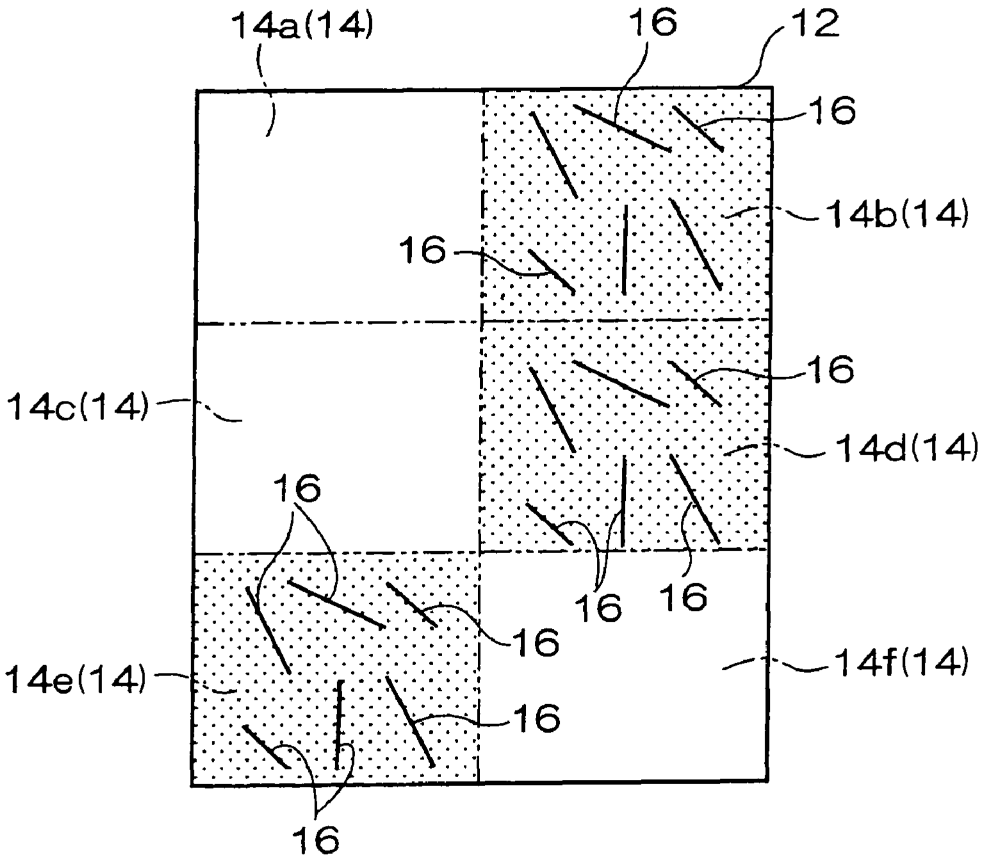
FIG. 2 is a schematic diagram showing an example of embedding information into a paper.

Firstly, here is a description of holding information into the paper 12 in the present embodiment. FIG. 2 is a schematic diagram of the paper 12. This paper 12 is formed in a predetermined thickness by a general method.

Figure 12:
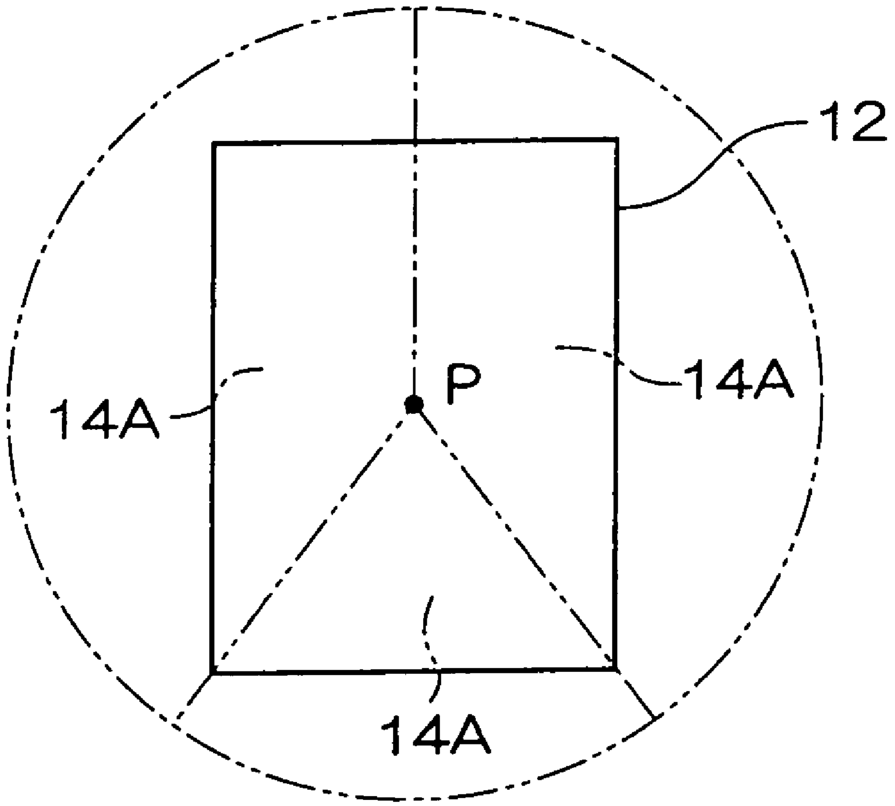
FIG. 12 is a schematic diagram showing another example of a paper sectioning method.

This paper 12 is sectioned with plural blocks 14 that are equally sectioned lengthwise and widthwise. In FIG. 12, as an example, it is formed in a rectangular shape, and is sectioned with 6 blocks 14*a* to 14*f* (blocks 14 when called generically) by being 3-sectioned lengthwise and 2-sectioned widthwise.

Moreover, in this paper 12, linear materials (hereunder, magnetic linear materials 16) formed from a magnetic material of a micro diameter and an arbitrary length are randomly embedded in preset blocks 14. This magnetic material 16 preferably has a diameter of 30 μm or more (radius of 15 μm or more). For example, if a thickness of the paper 12 is about 80 μm, the diameter of a line is preferably set to about 40 μm. The reason is so that the magnetic linear materials 16 do not generate protruberances on the surface of the paper 12, and the magnetic linear materials 16 become indistinctive, making it difficult to visually determine that the magnetic linear materials 16 are embedded in the paper 12.

Regarding the length of the magnetic linear material 16, in order to make it detectable using the Barkhausen effect, any length of 5 mm or more, preferably about 15 mm or more is applicable.

Furthermore, the magnetic linear material 16 may be formed using an arbitrary magnetic material having a low coercive force, such as an amorphous silicon comprising Co—Fe—Ni—B—Si.

In the paper 12, information is shown by a combination of blocks 14 embedded with the magnetic linear materials 16.

As shown in FIG. 1, the information reader 10 is formed by including a read section 18, and an information processing section 20. As the information processing section 20, an information processor of an arbitrary construction such as a personal computer or a work station, is applicable as long as various processing based on previously stored programs are possible.

Figure 3:
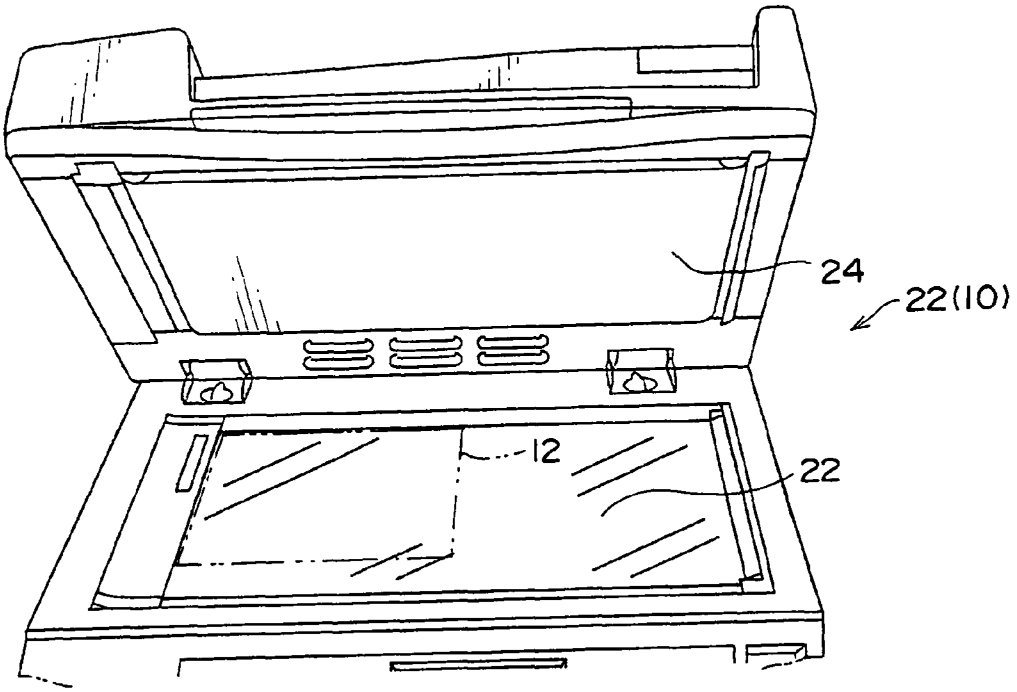
FIG. 3 is a schematic block diagram of a main part showing an example of a read table.

As shown in FIG. 3, the read section 18 includes a read table 22 and a cover 24 which covers the read table 22. The paper 12 mounted on the read table 22 is covered by the cover 24. Moreover, the cover 24 is installed with antenna units described later, on the read table 22 side.

In the read section 18, the Barkhausen effect is used to detect whether or not the respective blocks 14 in the paper 12 are embedded with the magnetic linear materials 16.

Figures 4A, 4B:
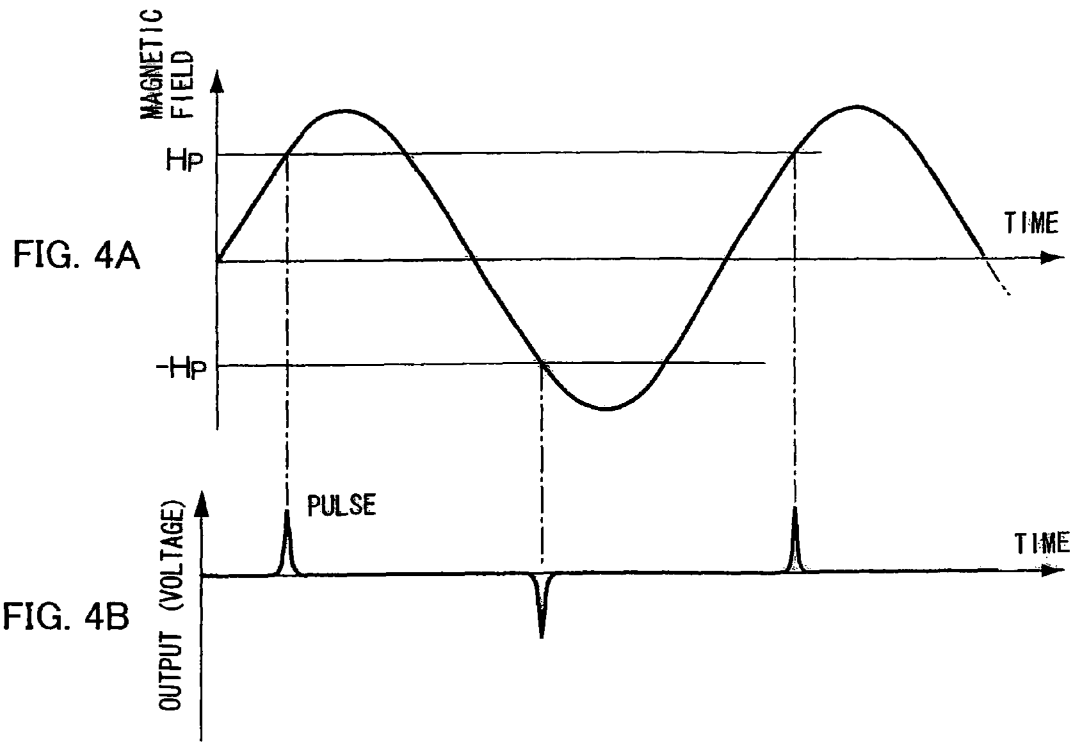
FIG. 4A is a linear diagram showing an outline of an alternating field.
FIG. 4B is a linear diagram showing an outline of a response signal with respect to the alternating field.

The magnetic linear material 16 has a relatively low coercive force, which makes a hysteresis loop in an approximate rectangular shape (not shown), and generates a sharp magnetization reversal. In the read section 18, such a paper 12 having a likelihood of being embedded with the magnetic linear materials 16 is subjected to an alternating field as shown in FIG. 4A. As shown in FIG. 4B, due to application of the alternating field, the magnetic linear material 16 generates a pulse-like response signal (magnetic noise), when a magnetization reversal is generated at a magnetization reversal point HP.

In the read section 18, the presence/absence of a response signal generated from the paper 12 can be detected for each block 14.

As shown in FIG. 1, the read section 18 is provided with a power supply (for example, an AC supply) 26 used for generating an alternating field. Moreover, the read section 18 is provided with a plurality of antenna units 32 including exciting coils 28 serving as an antenna which generates an alternating field by power supplied from the power supply 26, and detecting coils 30 serving as a detecting antenna which detects a response signal generated by the magnetic linear material 16.

In the read section 18, by supplying the AC power from the power supply 26 to each of the exciting coils 28, an alternating field is generated in each exciting coil 28. In the detecting coils 30, a current according to the alternating field generated by the corresponding exciting coils 28 is induced. At this time, if there are the magnetic linear materials 16 in an area facing the antenna unit 32, these magnetic linear materials 16 generate pulse-like response signals, which induce a current corresponding to the response signals in the detecting coil 30.

The read section 18 is provided with high-pass filters (HPF) 34, integrators 36, and A/D converters 38, corresponding to the respective detecting coils 30. Here, each HPF 34, integrator 36, and A/D converter 38 per one coil 30 are not individually shown, and they are shown lumped together respectively.

A current induced by each detecting coil 30 is input to the HPF 34. In the HPF 34, a low-frequency component is removed from the respective input current. The frequency of the power supply 26 is set lower than the frequency of a response signal generated by the magnetic linear materials 16. In the HPF 34, the frequency component of the power supply 26 is removed so that only the response signal component can pass through.

In each integrator 36, a current passed through the HPF 34 is integrated, and the A/D converter 38 A/D converts the integrated electric signal. As a result, the response signal generated by the magnetic linear material 16 is included in the current detected by the detecting coil 30, so that a voltage according to the intensity of the response signal is output as digital data.

Figure 5:
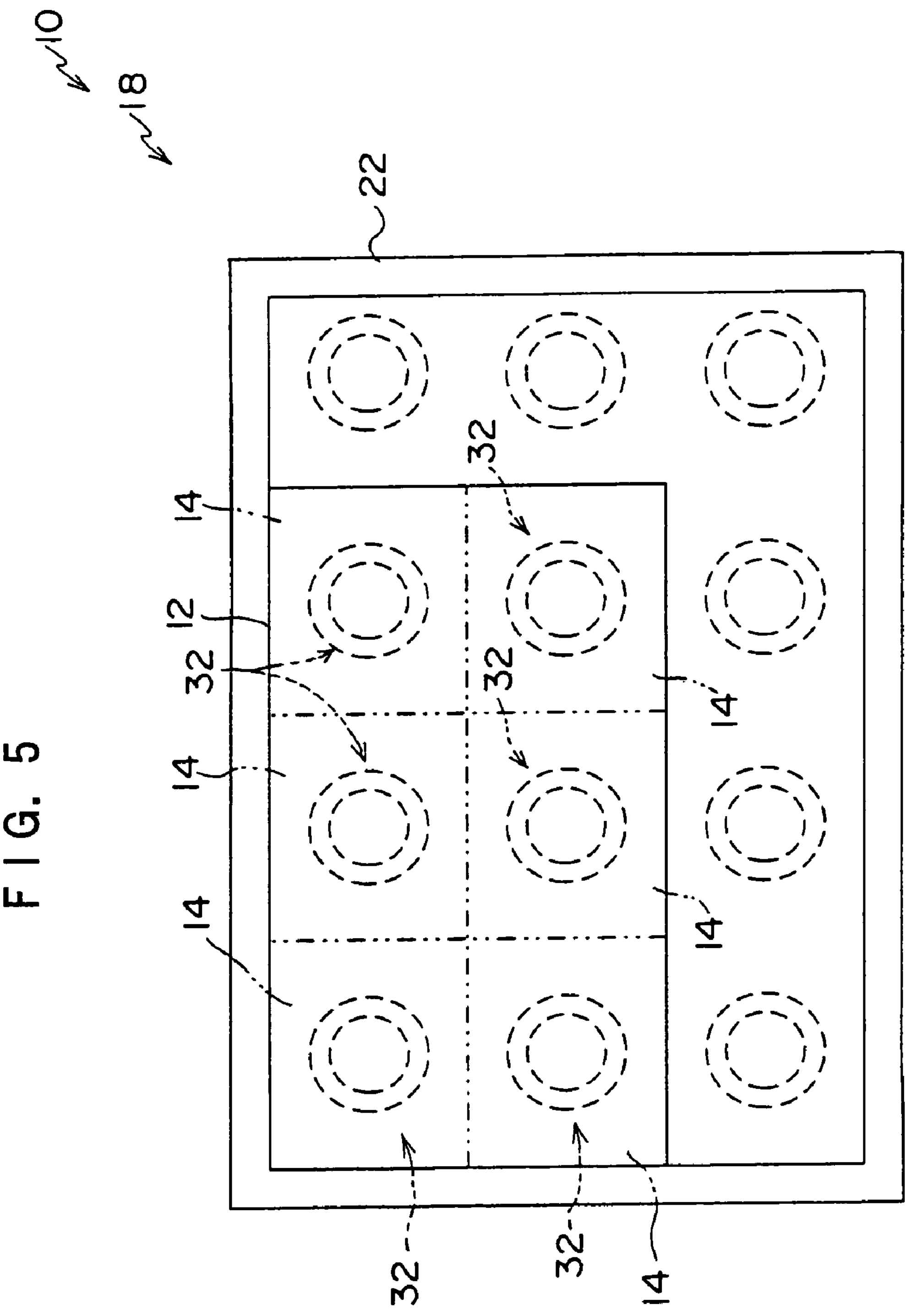
FIG. 5 is a schematic diagram showing mounting a paper on a read table, and an array of antenna units.

As shown in FIG. 5, the read table 22 of the read section 18 is arranged with antenna units 32 so that they face the respective blocks 14 of the paper 12, when the paper 12 is mounted on a predetermined position.

As a result, when a paper 12 is arranged on the read table 22, a signal corresponding to the presence/absence of a response signal is output by each block 14 in the paper 12. That is, each respective antenna unit 32 detects a response signal according to the number of facing or adjacent magnetic linear materials 16 (not shown in FIG. 5, refer to FIG. 2) or the like, and when the antenna unit 32 detects the response signal, the read section 18 outputs a detection signal of a level (voltage level) according to the detected response signal.

As a result, if the magnetic linear materials 16 are embedded into the respective blocks 14 in the paper 12, detection signals are output from the antenna units 32 corresponding to the blocks 14.

Based on these detection signals, the information processing section 20 determines information formed in the paper 12.

Incidentally, when the paper 12 is mounted on the read table 22 of the read section 18, the direction (e.g., upward direction) or the front and back of the paper 12 may be mistaken. Therefore, among the combinations of patterns formed by the blocks 14 (blocks 14 embedded with the magnetic linear materials 16) holding the information in the paper 12, combinations except for patterns matched when rotated 180° about the center of the paper 12, and patterns having mutually matching mirror images are used, and these combinations are designed to be information held in the paper 12, or codes indicating the information.

Figure 6A:
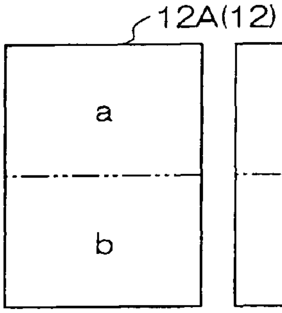
FIG. 6A to 6D are schematic diagrams showing patterns which can be taken when 2-sectioned blocks are arranged on a read table.
Figure 6B:
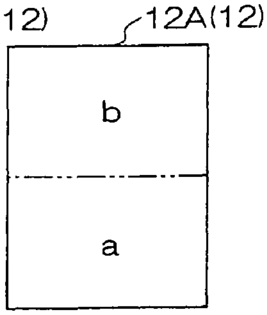
Figure 6C:
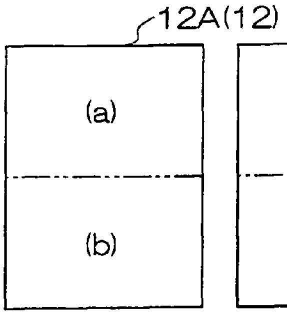
Figure 6D:
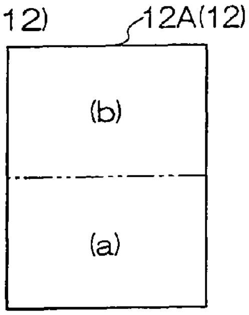

As shown in FIG. 6A, if the paper 12 (here, paper 12A) which is 2-sectioned lengthwise or widthwise and is set with two blocks a and b, is rotated, it becomes FIG. 6B. Moreover, a mirror image of the paper 12A becomes FIG. 6C, and a mirror image of the rotated paper 12A (FIG. 6B) becomes FIG. 6D.

At this time, the arrangement of the blocks a and b in the mirror image of the paper 12A is matched with the arrangement of the blocks a and b when the paper 12A is reversed (front and back are reversed). The blocks a and b when reversed (mirror image) are shown as blocks (a) and (b).

Figure 6E:
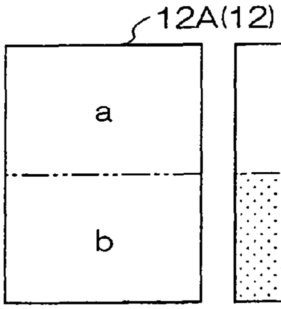
FIG. 6E to 6G are schematic diagrams showing combinations of information to be held.
Figure 6F:
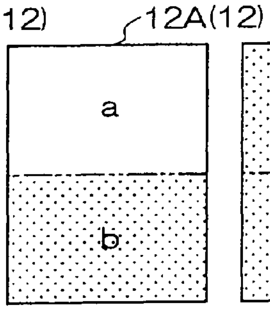
Figure 6G:
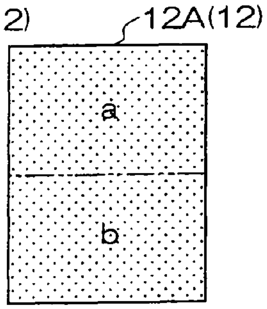

Here, excluding cases where the patterns are indistinguishable when rotated or are in the mirror image, three patterns of FIG. 6E, FIG. 6F, and FIG. 6G can be obtained. In FIG. 6E to FIG. 6G, it is shown that a plain area has no information (information “0”), and a hatched area has information (information “1”).

Thus, when the paper 12A is sectioned into two blocks a and b, about 1.5 bit of information on average can be held. Moreover, even excluding the combination of FIG. 6E (no information), 1 bit of information can be held.

Figure 7A:
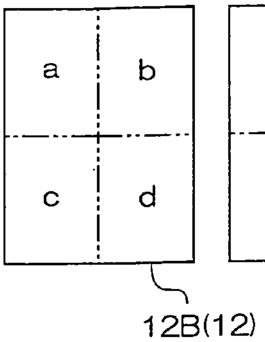
FIG. 7A to 7D are schematic diagrams showing patterns which can be taken when 4-sectioned blocks are arranged on a read table.
Figure 7B:
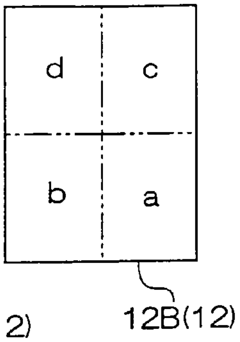
Figure 7C:
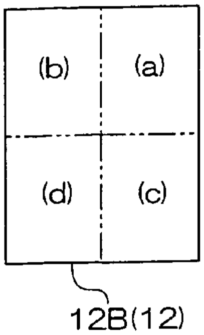
Figure 7D:
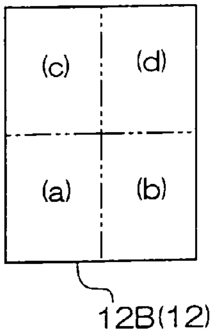

FIG. 7A to FIG. 7D show an example where the paper 12 (here, paper 12B) is respectively 2-sectioned lengthwise and widthwise and is set with four blocks a, b, c, and d. At this time, a condition where the paper 12B of FIG. 7A is rotated (180° rotation) is shown in FIG. 7B, and mirror images of FIG. 7A and FIG. 7B are respectively shown in FIG. 7C and FIG. 7D.

Figure 7E:
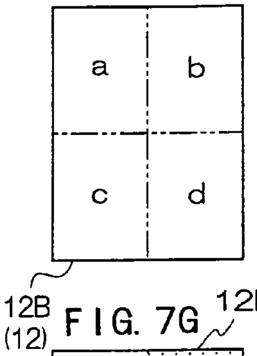
FIG. 7E to 7K are schematic diagrams showing combinations of information to be held.
Figure 7F:
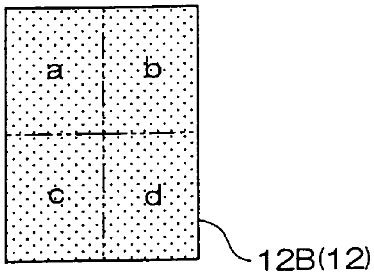
Figure 7G:
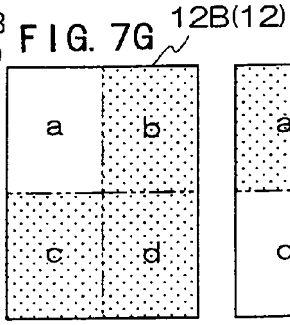
Figure 7H:
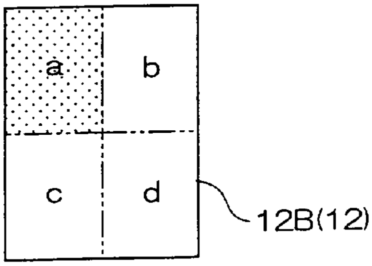
Figure 7I:
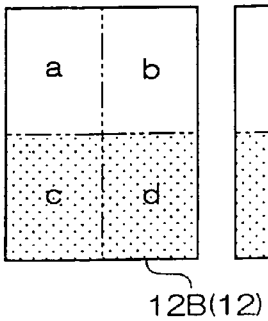

Here, excluding cases where the patterns are indistinguishable when the paper 12B is rotated or are in the mirror image, there are patterns having no information overall as shown in FIG. 7E, having information overall as shown in FIG. 7F, having no information in 1 block only as shown in FIG. 7G, and having information in 1 block only as shown in FIG. 7H. Moreover, as shown in FIG. 7I, there are patterns having information in the two blocks of a and d and no information in the other blocks which are indistinguishable, when rotated, from the case in which the only two blocks of b and c have information.

Figure 7J:
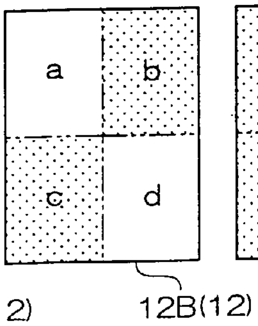
Figure 7K:
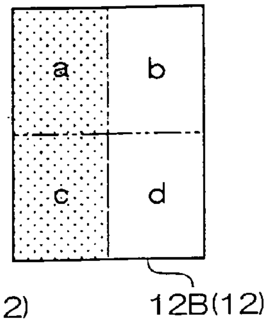
Figure 8D:
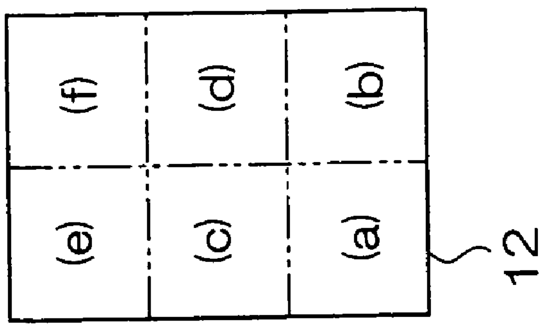
FIG. 8A to 8D are schematic diagrams showing patterns which can be taken when 6-sectioned blocks are arranged on a read table.
Figure 8C:
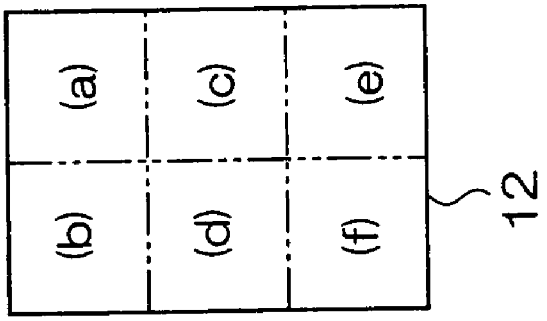
Figure 8B:
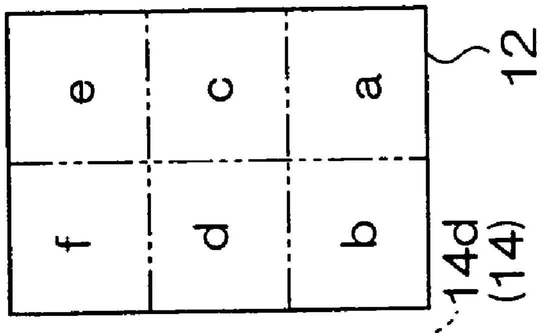
Figure 8A:
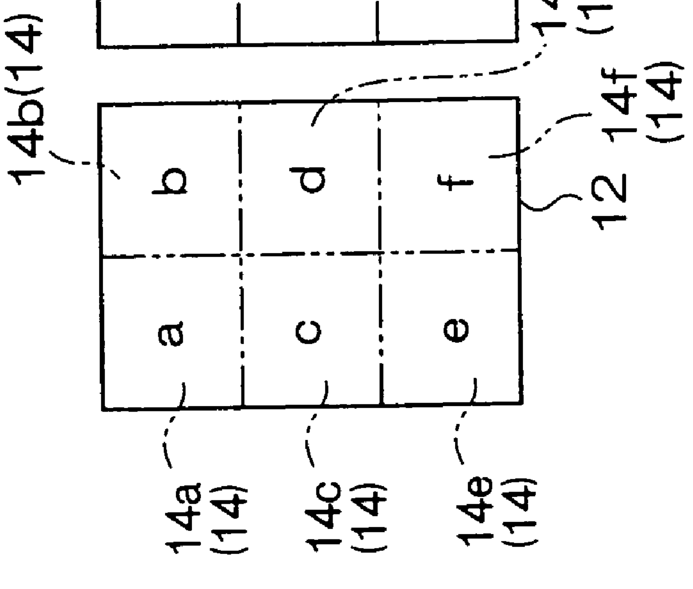

Furthermore, there are patterns having information in one of two blocks adjacent along the side direction of the paper 12B among blocks a to d, and no information in the rest. At this time, if the paper 12 is in a rectangular shape (not square) and the long side and the short side are clear and can be determined without mistake, there are combinations of FIG. 7J and FIG. 7K.

Thus, when the paper 12B is respectively 2-sectioned lengthwise and widthwise, 7 combination patterns can be obtained. Even excluding the combination pattern of FIG. 7E (no information), 6 combinations can be obtained, and the paper 12B is capable of holding 6 or 7 types of information.

Furthermore, as shown in FIG. 8, as an example, the paper 12 is 3-sectioned lengthwise and 2-sectioned widthwise to form 6 blocks. At this time, as shown in FIG. 8A, if the blocks 14*a* to 14*f* are respectively refer to blocks a to f, the arrangement of the blocks a to f when rotated becomes as shown in FIG. 8B. Moreover, the arrangements on mirror images with respect to FIG. 8A and FIG. 8B are shown in FIG. 8C and FIG. 8D.

Figures 9A, 9B, 9C, 9D, 9E, 9F, 9G, 9H, 9I, 9J, 9K, 9L, 9M, 9N, 9O, 9P, 9Q, 9R, 9S, 9T, 9U, 9V:
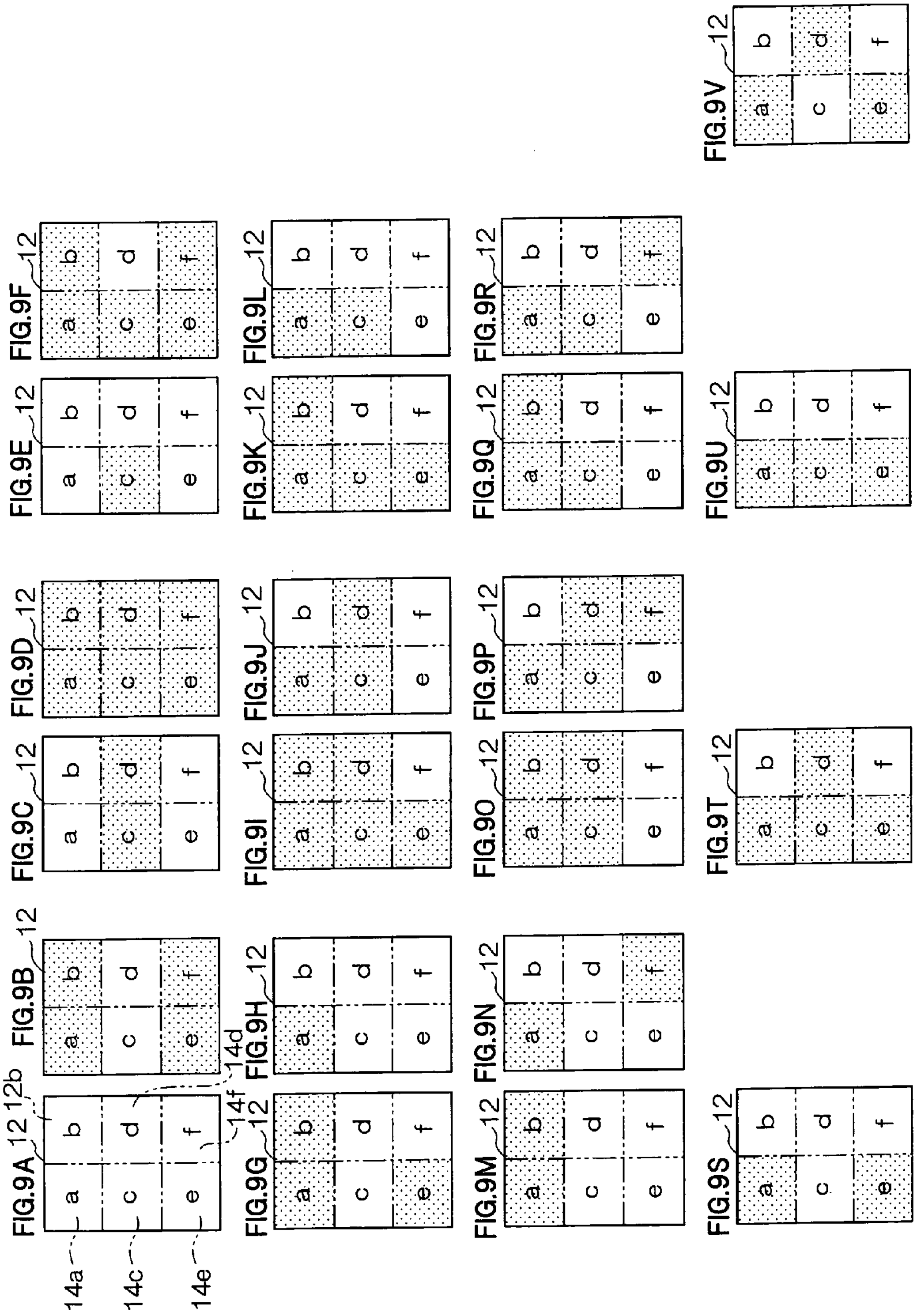
FIG. 9A to 9V are schematic diagrams showing combinations of information to be held in a 6-sectioned paper.

Thus, simulating patterns formed by having information (hatched areas) or having no information (plain areas), and excluding cases where the patterns are indistinguishable when rotated or in the mirror image, 22 patterns can be obtained as shown in FIG. 9A to FIG. 9V.

This can be inferred by applying the blocks a to d in the 4-sectioned paper 12B (refer to FIG. 7) to the blocks a, b, e, and f at four corners of the 6-sectioned one, and by applying the blocks a and b in the 2-sectioned paper 12A (refer to FIG. 6) to the blocks c and d of the 6-sectioned one.

Consequently, when the paper 12 is 6-sectioned, 22 types of codes can be held in this paper 12. At this time, if all blocks a to f (blocks 14*a* to 14*f*) have no information, it becomes difficult to determine whether or not the paper 12 holds information. Therefore, even excluding this combination (FIG. 9A), 21 types of codes can be held in the paper 12. In FIG. 8, the same information (code) as that of FIG. 9A can be held. In the method of sectioning the sheet area and the method of adding codes according thereto described above, since the number of sections is relatively small, it is possible to search, find, and allocate using a computer or the like.

In this manner, when information is read from the paper 12 holding information (for example, codes), the paper 12 is mounted on the information reader 10. At this time, in the read section 18 of the information reader 10, the paper 12 is placed on the read table 22 with reference to the long side, for example. As a result, the respective blocks 14 in the paper 12 faces to the antenna units 32.

In this condition, by supplying power from the power supply 26 to the exciting coils 28 of the respective antenna units 32, alternating fields are applied to the respective blocks 14 of the paper 12.

In a block 14 embedded with no magnetic linear material 16, no response signal from the magnetic linear materials 16 is received. However, in a block 14 embedded with magnetic linear materials 16, the magnetic linear materials 16 generate a pulse-like response signal with respect to the alternating field, and a current according to the response signal is induced in the detecting coil 30.

As a result, in the read section 18, from the antenna unit 32 facing the block 14 embedded with the magnetic linear materials 16, a voltage according to the embedded magnetic linear materials 16 is output.

In the information processing section 20, from the output signal from this read section 18, the presence/absence of the magnetic linear material 16 in the respective blocks 14 of the paper 12, that is the blocks 14 embedded with the magnetic linear materials 16 can be identified.

As a result, from the pattern formed by the blocks 14 embedded with the magnetic linear materials 16, it becomes possible to determine information held in the paper 12.

Incidentally, when the paper 12 is mounted on the read table 22, if the direction or the front and back of the paper 12 are unclear even with reference to the long side for example, then it may be mounted while the direction (e.g., upward direction) or the front and back are mistaken. As a result, for example, even for one block 14 of the paper 12, the facing antenna unit 32 becomes different.

That is, when a certain direction is considered as a normal direction, the paper 12 may be mounted on the read table 22 in any of four directions with respect to the normal direction, namely; the normal direction, an opposite direction, a reversed direction, and a reversed opposite direction.

As a result, if information is held in the paper 12 merely by means of the presence/absence of information in the respective blocks 14, reading errors of information will occur.

Accordingly, regarding patterns formed on the paper 12 by the blocks 14 having information (having the magnetic linear materials 16) and the blocks 14 having no information (having no magnetic linear material 16), patterns matched when the paper 12 is rotated, is in the mirror image, or is in the rotated mirror image, are set to indicate the same information.

As a result, when the paper 12 is mounted on the read table 22 in order to read information held by the paper 12, no reading error due to the direction of the paper 12 occurs.

Consequently, in the paper 12 which is sectioned into a plurality of blocks 14, and predetermined information is held in the paper 12 by combinations of bits (1 (present), 0 (absent)) shown by the respective blocks 14, the information held by the paper 12 can be unerringly read.

The paper 12 holding information in this manner, can be used as a label for distinguishing types of drugs, poisons, or medicines in a container, a label attached to various goods and products such as cosmetics, a label showing a production time, and the like. That is, it can be used when it is necessary to unerringly distinguish the content while the contents are specifically limited. At this time, it becomes possible to unerringly read information regardless of the direction of reading the label.

Moreover, usage as a label showing a production time, or a label showing a guaranteed term, an expiration date, and the like, is also applicable, if the term indicated by the label is relatively short, since the required information (types of codes) is minimal. Moreover, the paper 12 (label) can be used permanently even the number of information that can be held in it is limited, by newly allocating information indicating a term to term information which the term has elapsed.

Various methods can be applied as a method of embedding the magnetic linear materials 16 into desired blocks 14, among the blocks 14 set by sectioning the paper 12.

Figure 10:
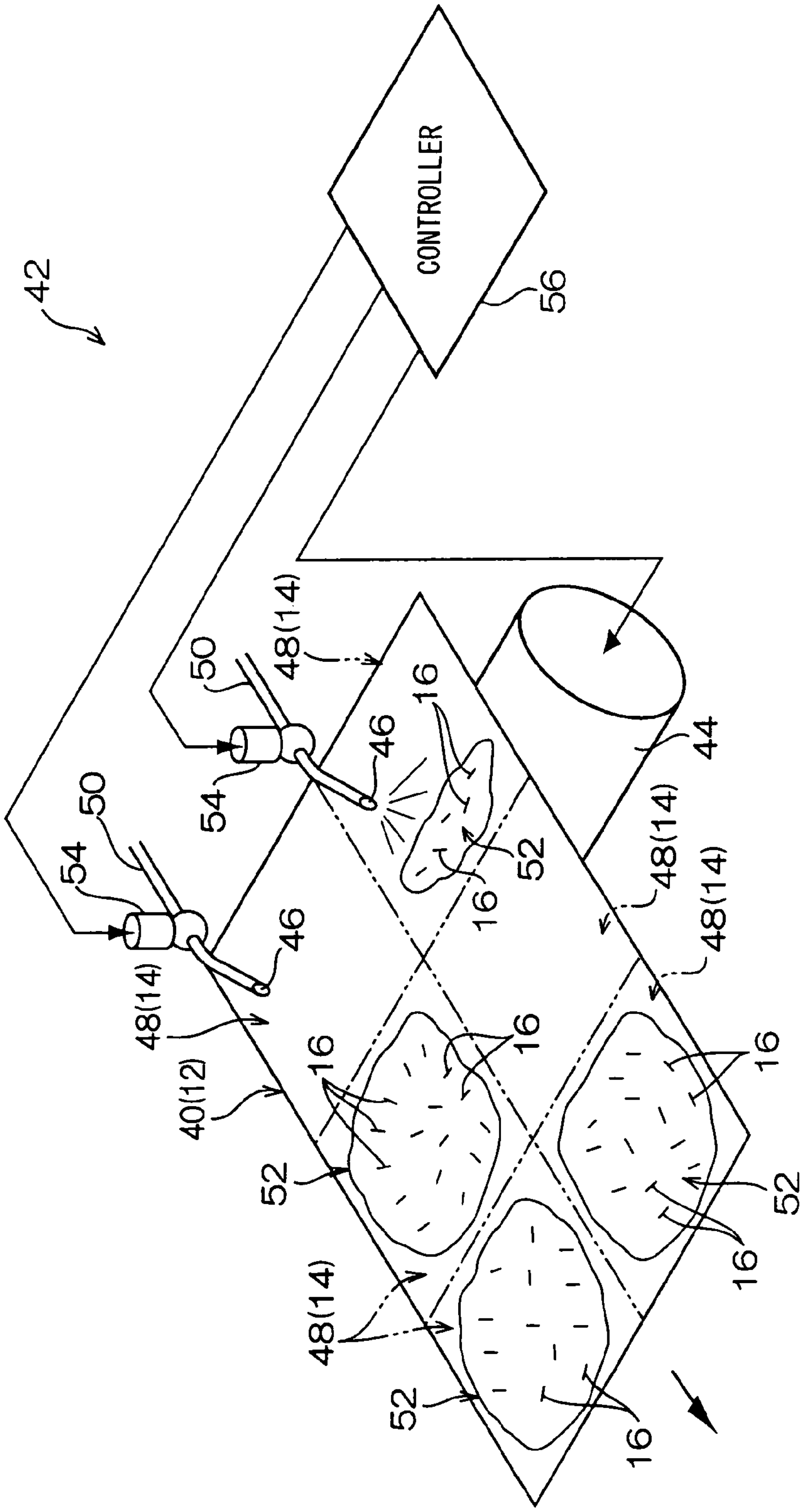
FIG. 10 is a schematic block diagram of a main part showing an example of a embedding apparatus (paper machine) applied to embedding magnetic linear materials into a paper.

Here is a description of an example of embedding of the magnetic linear materials 16 into the paper 12, with reference to FIG. 10. As an example, the method is described where a wet paper web 40 is formed using a paper machine such as a Fortlinear paper machine or Tanmo paper machine (using short net), the magnetic linear materials 16 are applied thereon, and a wet pulp (not shown) or the like is laid over and adhered on this wet paper web 40, so as to form one sheet of paper 12.

FIG. 10 is a schematic block diagram of a main part of an embedding apparatus 42 used for forming the paper 12 embedded with the magnetic materials 16 in arbitrary areas. This embedding apparatus 42 includes a conveying roller 44, and by means of this conveying roller 44, the wet paper web 40 that is used to form the paper 12 serving as an information holding object, is conveyed in a predetermined direction at a constant speed (conveying direction is shown by the arrow in FIG. 10).

As an example, in this apparatus 42, the wet paper web 40 is conveyed along the longitudinal direction. On the paper 12 to be formed by using the wet paper web 40, the blocks 14 are set so that a number of sections along the conveying direction is 3 and a number of sections along the widthwise direction is 2. The arrangement is not limited to the conveying roller 44, and an arbitrary conveying device such as a belt is also applicable.

This embedding apparatus 42 is provided with discharge openings 46 of a number corresponding to the number of sections in the widthwise direction (orthogonal direction to the conveying direction) of the paper 12. Each discharge opening 46 is provided to face for example a conveying direction widthwise central portion of an area 48 of the wet paper web 40 corresponding to each block 14 on the paper 12.

Each discharge opening 46 is supplied with water (hereunder, application liquid 52) mixed with the magnetic linear materials 16 having a predetermined length or more, via a solution sending pipe 50. Moreover, the solution sending pipe 50 corresponding to each discharge opening 46 is provided with a valve 54 using for example a solenoid valve or the like.

The embedding apparatus 42 comprises a controller 56 which controls conveying the wet paper web 40 by the conveying roller 44, and opening/closing of the valves 54. The controller 56 opens/closes the valves 54 individually at a timing synchronized with the conveying the wet paper web 40, enabling spraying the application liquid 52 onto arbitrary areas 48 on the wet paper web 40.

In the embedding apparatus 42 constructed in this manner, data specifying the blocks 14 to be embedded with the magnetic linear materials 16 per each paper 12 is input to the controller 56. The controller 56 controls conveying the wet paper web 40, and opening/closing the valves 54 based on the input data, while synchronizing with the conveying the wet paper web 40.

As a result, the application liquid 52 blended with the magnetic linear materials 16 is applied onto areas 48 on the wet paper web 40 corresponding to the blocks 14 based on the data.

By laying the wet pulp over this wet paper web 40, the magnetic linear materials 16 are fixed. As a result, the paper 12 having predetermined blocks 14 embedded with the magnetic linear materials 16 can be obtained.

Here the method of embedding the magnetic linear materials 16 in specified block 14 is explained. However, the method of holding information by embedding the magnetic linear materials 16 into blocks 14 of the paper 12 is not limited to this. For example, it may be such that the magnetic linear materials 16 are embedded into all blocks 14 on the paper 12, and the paper 12 holds information by whether the magnetic linear material 16 is detected (having information), or no magnetic linear material 16 is substantially detected (having no information) by destroying the property of the magnetic linear material, namely Barkhausen effect, for each block 14 on the paper 12.

As a result, it may be such that, the paper 12 can hold predetermined information by producing blocks 14 holding information, and blocks 14 having information lost.

An example thereof is described with reference to FIG. 11A to FIG. 11C. Firstly as shown in FIG. 11A, long magnetic linear materials 16 (hereunder, magnetic linear materials 16A) are embedded along the lengthwise direction or the widthwise direction, so as to form a paper 12 (hereunder, paper 12C) that is provided with the magnetic linear materials 16A extending over the blocks 14 along the lengthwise direction or the widthwise direction. Here, as an example, the paper 12A is 2-sectioned lengthwise and widthwise, to set 4 blocks 14, and two magnetic linear materials 16A are embedded along the longitudinal direction of the paper 12C.

Figure 11B:
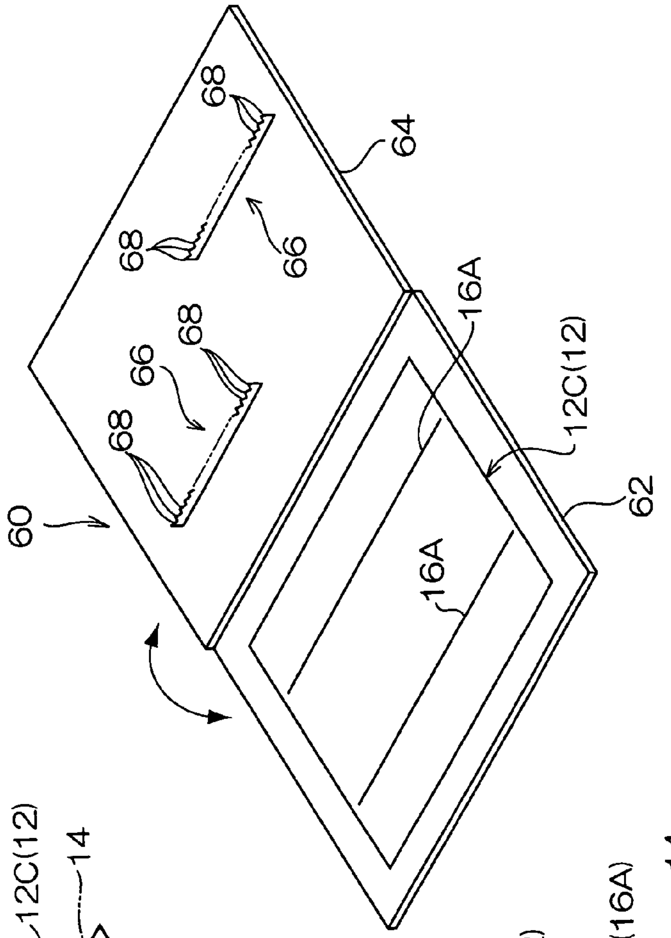
Figure 11A:
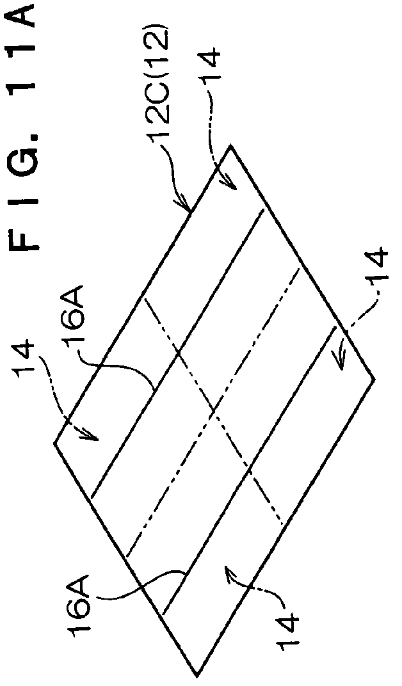

FIG. 11B shows a binder 60 as an example of an information adding device used for producing information into this paper 12C. This binder 60 is provided with a substrate 62 and a movable plate 64 having a greater size than that of the paper 12C, as a pair.

The substrate 62 and the movable plate 64 are connected by a hinge (not shown) on one lengthwise side. The movable plate 64 is rotatable between a position where movable plate 64 is released from the substrate 62, and a position where it is superposed on the substrate 62. As a result, the binder 60 can sandwich the paper 12C between the substrate 62 and the movable plate 64.

The binder 60 is designed so that the paper 12C can be positioned and mounted on a predetermined position on the substrate 62. Moreover, on the movable plate 64 can be attached a set of projections 66 on the surface facing the substrate 62.

This projection 66 has approximately the same length as the longitudinal length of the linear material 16A of one block 14. Moreover, the entire projection 66 on the binder is formed with a set of minor projections 68 or protuberance at predetermined intervals along the longitudinal direction.

The interval between the smaller projections 68 formed on this projection 66 is for example 5 mm or less. As a result, in a condition where the projection 66 is faced to the magnetic linear material 16A of one block 14, by pressing the projections 68 against the paper 12A, the magnetic linear material 16A in the block 14 can be sectioned into lengths of 5 mm or less.

The projections 68 are designed to section the magnetic linear material 16A in the paper 12C, without damaging the paper 12C, by being pressed against the paper 12A so that the tips slightly penetrate into the paper 12C.

As described above, when the magnetic linear material (magnetic linear material 16) is detected using the Barkhausen effect, the length of the magnetic linear material is required to be 100 times or more (here, about 5 mm or more) with respect to the diameter. If the length of the magnetic linear material is less than 100 times with respect to the diameter, the demagnetic field becomes greater, and detection using the Barkhausen effect becomes difficult.

From here, in the binder 60, the projection 66 is used to section the magnetic linear material 16A, so that the lengths of the sectioned magnetic linear material 16A (hereunder, magnetic linear material 16B) are less than 100 times as its diameter. As a result, this makes magnetic linear material 16B difficult to be detected using the Barkhausen effect.

When predetermined information is to be held in the paper 12C using this binder 60, the paper 12C is mounted on a predetermined position on the substrate 62, and the movable plate 64 is attached with the projection 66 in a position facing the magnetic linear material 16A in a block 14 which is to be set to have no information. In this condition, the paper 12C is sandwiched by superposing the substrate 62 and the movable plate 64.

Figure 11C:
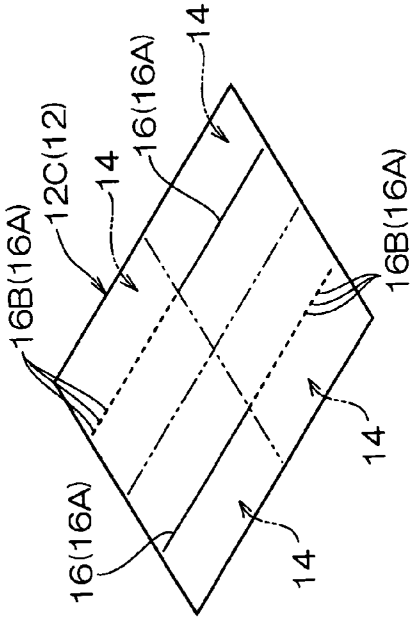

As a result, as shown in FIG. 11C, the projection 66 sections the magnetic linear material 16A facing thereto into magnetic linear materials 16B of a minute size.

Consequently, a block 14 in the paper 12C facing the projection 66 is set to have no information. Moreover, in a block 14 not facing the projection 66, magnetic linear material 16 that is detectable by the Barkhausen effect is formed, and predetermined information is held in the paper 12C.

Here, the magnetic linear materials 16 are placed in predetermined positions, so as to form magnetic linear materials 16A in blocks 14 having information, and to form magnetic linear materials 16B in blocks 14 having no information. However, the arrangement is not limited to this, and it may be applied to a paper 12 randomly embedded with magnetic linear materials 16 having a predetermined length or more (length generating the Barkhausen effect). For example, using a plate material facing an overall area of one block 14 in the paper 12, the whole surface of this plate material is formed with projections or the like which section the magnetic linear materials 16 into a minute size. At this time, the interval between adjacent projections is cut into a predetermined length or less (for example, 5 mm or less).

This plate material is pressed against the blocks 14 of the paper 12, so as to section the respective magnetic linear materials 16 embedded in the corresponding blocks 14 into a minute size of a predetermined length or less, so that the underlying blocks 14 can be set to have no information.

Moreover, as a method of suppressing the Barkhausen effect of the magnetic linear materials 16 embedded into blocks 14, there is a method of covering the corresponding blocks 14 (blocks 14 to have no information) on the paper 12 with a magnetic material.

As a method of selectively covering with a magnetic material without losing the function as the paper 12, for example there is a method of forming a seal containing iron pieces, and adhering this seal onto a block 14 which is to lose information. The seal at this time may contain magnetic powder material made of such as iron powder, instead of iron pieces.

Moreover, an electromagnetic wave absorber may be used to suppress the Barkhausen effect, so as to form a block 14 having no information. Generally, an electromagnetic wave absorber generates noise by receiving a magnetic force. As a result, even if the magnetic linear materials 16 embedded into the paper 12 cause the Barkhausen effect, the response signal is hidden by the noise, making it difficult to detect effectively the response signal. Therefore, the corresponding blocks 14 can be considered to have no information.

Furthermore, a method of using a magnetic material having a higher coercive force than that of the magnetic linear materials 16 embedded into the paper 12, is also possible. At this time, the magnetic material having a high coercive force may be processed into a seal form, or the magnetic material may be included in the seal which is then adhered to the paper 12.

As a result, when a magnetic field generating the Barkhausen effect is applied to the magnetic linear materials 16 in the paper 12, the magnetic material having a high coercive force is magnetized, generating a residual field. As a result, when a magnetic field is applied, the Barkhausen effect is hardly generated, making it difficult to detect the magnetic linear materials 16 embedded in the corresponding blocks 14. Therefore, the corresponding blocks 14 can be considered to have no information effectively.

When the Barkhausen effect is suppressed by applying these method, it is not limited to the method of adhering a seal or the like to the selected blocks 14, and it may be such that a film-like sheet holding iron pieces, iron powder, an electromagnetic wave absorber, or a magnetic material having a high coercive force which suppresses the Barkhausen effect, in areas corresponding to the blocks 14 to have no information, is formed in the same size as that of the paper 12, and adhered to the paper 12. Moreover, various methods such as laminating the paper 12 by the sheet, may be applied.

In the present embodiment described above, examples where the paper 12 is 2-sectioned, 4-sectioned, and 6-sectioned, are described. However, the number of sections in the paper 12 is not limited to these. It may be such that the magnetic linear materials 16 are embedded into respective blocks that are 4-sectioned lengthwise and 3-sectioned widthwise, so as to hold predetermined information. At this time, a reading device arranged with the detecting coils 30 or the antenna units 32 in positions facing the respective sectioned blocks, may be used.

Moreover, in the present embodiment, the blocks 14 are set by evenly sectioning the paper 12 lengthwise or widthwise. However, the sectioning method of the paper 12 is not limited to this. For example, as shown in FIG. 12, it is also possible to apply blocks 14A sectioned at predetermined angles in the rotation direction, about a central point P of the paper 12.

When such a sectioning method is applied, a reading device may be constructed so as to enable detecting the presence/absence of information in the respective blocks 14A, respectively in the rotated position and the mirror image position.

Furthermore, the present embodiment was described using as an example, the paper 12 (recording paper) as the sheet material to be embedded with the magnetic linear materials 16. However, the present invention is not limited to this. It may be a sheet-like material formed from an arbitrary material which is not magnetized or difficult to be magnetized, such as a sheet-like resin plate formed from resins, fibers such as fabrics or the like, a metal foil such as an aluminum foil, or a sheet-like metal plate formed from aluminum and the like.

Moreover, in the present embodiment, as a method of setting information in the respective sectioned blocks 14, the magnetic linear materials 16 enabling detection of the presence/absence of information by the Barkhausen effect, are used. However, the method of setting the presence/absence of information in the respective blocks 14, is not limited to this. For example, a transparent fluorescent paint which emits light by reacting to black light is also possible. Moreover, a detection method in the manner of setting the presence/absence of information may be applied. Furthermore, if the magnetic material is used, it is possible to remotely detect the corresponding paper. Therefore, it is also applicable to preventing document contents from leaking into the third party.

As described above, the information holding method according to an aspect of the present invention includes: setting plural consecutive blocks by evenly sectioning a surface of a sheet material in predefined positions, and holding predetermined information expressed in the whole area of the sheet material by the presence/absence of information for each of the blocks.

Here, the presence/absence of information in the blocks may be the presence/absence of a magnetic material which generates a pulse-like response signal by applying an alternating magnetic field.

According to an aspect of this invention, when a surface of a sheet material such as a recording paper is evenly sectioned, and the presence/absence of information (for example, having no information is "0", and having information is "1") is set for each of the respective blocks, and for example, a magnetic material detectable by the Barkhausen effect is used.

As the sheet material, a recording paper embedded with the magnetic material in a linear shape in a predetermined area, may be used.

Moreover, in the present invention, a pattern formed on the sheet material by blocks having information, may be a pattern according to information held in the sheet material.

According to this construction, information such as a code held in the sheet material is shown by the pattern formed by blocks having information. As a result, it becomes possible to unerringly ascertain information held in the sheet material, by the pattern obtained from the presence/absence of the information for each of the blocks.

Moreover, the present invention may be constructed such that, a pattern which coincides with the pattern when rotated about a central point of the sheet material, is defined to have the same information, and when the sheet material is formed in a rectangular shape, a mirror image with respect to a mirror surface along one side, is set to have the same information.

That is, a combination of blocks having the same pattern when the sheet material is rotated or reversed, may be set to have the same information. As a result, when information is read from the sheet material, it can be unerringly read regardless of the direction of the sheet material.

As described above, according to an aspect of the present invention, unerringly readable information with a simple structure can be held in a sheet material.

The foregoing description of the embodiments of the present invention has been provided for the purposes of illustration and description. It is not intended to be exhaustive or to limit the invention to the precise forms disclosed. Obviously, many modifications and variations will be apparent to practitioners skilled in the art. The embodiments were chosen and described in order to best explain the principles of the invention and its practical applications, thereby enabling others skilled in the art to understand the invention for various embodiments and with the various modifications as are suited to the particular use contemplated. It is intended that the scope of the invention be defined by the following claims and their equivalents.

What is claimed is:

1. An information holding method comprising:

defining a plurality of consecutive blocks that evenly section a sheet material; and holding predetermined information expressed in the whole area of the sheet material by a combination of the presence/absence of information in each of the blocks, wherein the presence/absence of information in the blocks includes the presence/absence of a magnetic material which generates a pulse-like response signal by applying an alternating field.

2. The information holding method according to claim 1, wherein the sheet material includes a recording paper embedded the with linear magnetic material in each of the blocks.

3. The information holding method according to claim 1, wherein a pattern formed on the sheet material by blocks having information, is a pattern according to information held in the sheet material.

4. The information holding method according to claim 3, wherein a pattern which coincides with the pattern when rotated around a central point of the sheet material, expresses the same information as that of the pattern.

5. The information holding method according to claim 3, wherein when the sheet material is formed in a rectangular shape, a mirror image with respect to a mirror surface along one side of the pattern, expresses the same information as that of the pattern.

6. A method of forming an information holding sheet material comprising:

defining on a sheet material a plurality of consecutive blocks that evenly section the sheet material; and embedding a magnetic material in each of the plurality of consecutive blocks so that predetermined information is expressed in the whole area of the sheet material by a combination of the presence/absence of information for each of the blocks, wherein the presence/absence of information in the blocks includes the presence/absence of a magnetic material which generates a pulse-like response signal by applying an alternating field.

7. The information holding method according to claim 1, wherein each block has a same length and a same width, and each block has at least a length side adjoining a length side of a first adjoining block, and at least a width side adjoining a width side of a second adjoining block, different from the first adjoining block.

8. The method according to claim 6, wherein each block has a same length and a same width, and each block has at least a length side adjoining a length side of a first adjoining block, and at least a width side adjoining a width side of a second adjoining block, different from the first adjoining block.

* * * * *